(12) United States Patent
Marioni (10) Patent No.: US 8,094,310 B2
(45) Date of Patent: Jan. 10, 2012

(54) OPTICAL ALIGNMENT TOOL AND METHOD OF ALIGNMENT

(75) Inventor: Fabio Marioni, Saronno (IT)

(73) Assignee: Media Lario S.r.l., Boslsio Parini (IT)

( * ) Notice: Subject to any disclaimer, the term of this patent is extended or adjusted under 35 U.S.C. 154(b) by 146 days.

(21) Appl. No.: 12/449,134

(22) PCT Filed: Feb. 4, 2008

(86) PCT No.: PCT/EP2008/000872
§ 371 (c)(1),
(2), (4) Date: Jul. 24, 2009

(87) PCT Pub. No.: WO2008/092707
PCT Pub. Date: Aug. 7, 2008

(65) Prior Publication Data
US 2010/0091283 A1    Apr. 15, 2010

(30) Foreign Application Priority Data

Feb. 2, 2007   (EP) ..................................... 07425059

(51) Int. Cl.
*G01B 11/00* (2006.01)
(52) U.S. Cl. ...................................................... 356/400
(58) Field of Classification Search .................. 356/400, 356/401, 386
See application file for complete search history.

(56) References Cited

U.S. PATENT DOCUMENTS 4,525,852 A * 6/1985 Rosenberg ....................... 378/34
7,715,129 B2 * 5/2010 Neely et al. ................... 359/821
2003/0047660 A1 3/2003 Gaunt et al.
2004/0212792 A1 10/2004 Miyajima

OTHER PUBLICATIONS

Goldberg et al., "preparations for extreme ultraviolet interferometry of the 0.3 numerical aperture micro exposure tool optic," J. Vac. Sci. Technol. B 21(6) Nov./Dec. 2003.
Tichenor et al., "EUV engineering test stand," Proc. SPIE vol. 3997 (2000), pp. 48-48.

* cited by examiner

*Primary Examiner* — Tarifur Chowdhury
*Assistant Examiner* — Abdullahi Nur
(74) *Attorney, Agent, or Firm* — Opticus IP Law PLLC (57) ABSTRACT

An alignment tool for use in calibrating an optical bench and/or alignment of an optical system such as a collector optical system for EUV and X-ray applications is disclosed. The optical system includes multiple nested mirrors attached to a mechanical support. The tool includes a mechanical interface plate, a lower reference ring, an upper reference ring and a pinhole member disposed spaced apart axially in sequence; a first positioning device attached to the mechanical interface plate and to the lower reference ring; the first positioning device being adapted for precisely adjusting the position of the lower reference ring in two dimensions; a second positioning device attached to the mechanical interface plate and to the upper reference ring and adapted for precisely adjusting the position of the upper reference ring in two dimensions; a third positioning device attached to the upper reference plate and to the pinhole member and adapted for precisely adjusting the position of the pinhole member in three dimensions; a mechanical interface mounted on or integral with the mechanical interface plate and being substantially identical in form to that of the mechanical support of the optical system.

6 Claims, 10 Drawing Sheets

OPTICAL ALIGNMENT TOOL AND METHOD OF ALIGNMENT

CLAIM OF PRIORITY

This application claims the benefit of priority under 35 U.S.C. §365 of International Patent Application Serial No. PCT/EP2008/000872, filed on Feb. 04, 2008, designating the United States of America, which in turn claims the benefit of priority of European Patent Application Serial No. EP 07425059.8, Filed on Feb. 02, 2007, with both Applications being incorporated by reference herein.

FIELD OF THE INVENTION

The present invention relates to optical systems, and more particularly to an alignment tool for such systems, especially collector optical systems, and to the use of such tools.

BACKGROUND ART

A well known optical design for a collector for X-ray applications is the type I Wolter telescope. The optical configuration of type I Wolter telescopes consists of nested double-reflection mirrors operating at grazing incidence angles.

More recently, a variation of the type I Wolter design already proposed for other applications, in which the parabolic surface is replaced by an ellipsoid, has found application for collecting the radiation at 13.5 nm emitted from a small hot plasma used as a source in Extreme Ultra-Violet (EUV) microlithography, currently considered a promising technology in the semiconductor industry for the next generation lithographic tools.

Figure 1:
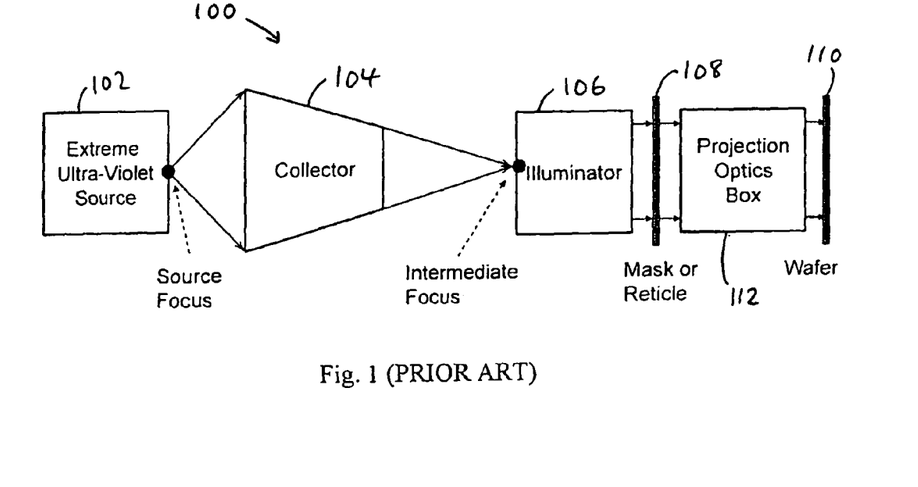
FIG. 1 (PRIOR ART) shows a simplified block diagram of an EUV lithography system.

A simplified block diagram of an EUV lithography system is shown in FIG. 1 (PRIOR ART). The ultra-violet source 102 is normally a hot plasma the emission of which is collected by the collector 104 and delivered to an illuminator 106. The latter illuminates a mask or reticle 108 with the pattern to be transferred to the wafer 110. The image of the mask or reticle is projected onto the wafer 110 by the projection optics box 112.

Figure 2:
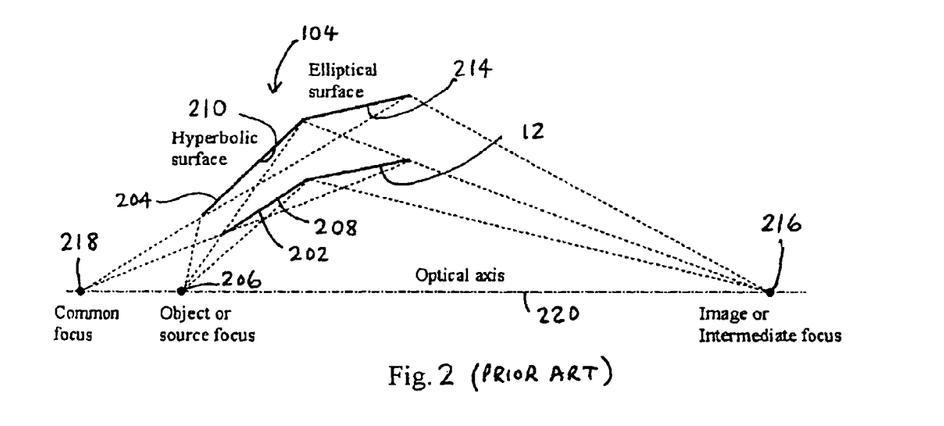
FIG. 2 (PRIOR ART) depicts the conceptual optical layout of a known type I Wolter collector, for use in the EUV lithography system of FIG. 1.

FIG. 2 (PRIOR ART) depicts the conceptual optical layout of a known type I Wolter collector 104 for EUV plasma sources. In the nested Wolter I configuration, each mirror is a thin shell consisting of two sections (surfaces). Although many more nested mirrors in the collector optical system 104 may be illustrated, only two (202, 204) are shown. The radiation from the source 206 is first reflected by the hyperbolic surfaces 208, 210, then reflected by the elliptical surfaces 212, 214, and finally focused to an image or intermediate focus 216 on the optical axis 220. As in the type I Wolter telescope mentioned above, the elliptical (212, 214) and the hyperbolic (208, 210) surfaces share a common focus 218. For each of the mirrors 202, 204, etc. the different sections on which the surfaces 208, 212 are disposed may be integral, or may be fixed or mounted together.

In the aforementioned optical systems (for EUV and X-ray applications, mainly in the medical, astronomical and lithographical fields), a series of nested grazing incidence mirrors (mainly elliptical and Wolter I) are co-aligned, one with respect to the other, and all with respect to their mechanical support.

The alignment respect the mechanical support is very important because, when met, it assures that the entire optical system, when positioned in the machine (e.g. lithography system) for which it is designed, is automatically aligned, and no complex additional alignment systems and no additional alignment processes are required.

This plug-in capability is particularly useful when lithographic applications are concerned because the optical system must be replaced at frequent intervals, and because the machine downtime must be minimized during 7 h/day, 7 days/week mass production cycles.

A problem with known systems is how to provide mounting of the mirrors of the optical system with respect to each other and to the mechanical support, so that the mirrors are fixed to the mechanical support in aligned configuration.

A further problem with existing systems is that once the mechanical support is mounted in the machine, further, post-mounting, alignment of the optical system is usually required.

SUMMARY OF THE INVENTION

The present invention seeks to address the aforementioned and other issues.

According to one aspect of the invention there is provided an alignment tool for calibrating an optical bench and/or use in alignment of an optical system, the optical system including multiple nested mirrors attached to a mechanical support, the tool comprising: a mechanical interface plate, a lower reference ring, an upper reference ring and a pinhole member, the mechanical interface plate, lower reference ring, upper reference ring and pinhole member being disposed spaced apart axially in sequence; a first positioning device, attached to the mechanical interface plate and to the lower reference ring; the first positioning device being adapted for precisely adjusting the position of the lower reference ring in two dimensions; a second positioning device, attached to the mechanical interface plate and to the upper reference ring; the second positioning device being adapted for precisely adjusting the position of the upper reference ring in two dimensions; a third positioning device, attached to the upper reference ring and to the pinhole member; the third positioning device being adapted for precisely adjusting the position of the pinhole member in three dimensions; a mechanical interface, the mechanical interface being mounted on or integral with the mechanical interface plate and being substantially identical in form to that of the mechanical support of the optical system.

Preferably, in use, the axis of the tool is vertical.

Preferably, the first positioning device comprises an x,y translation stage. Preferably, the second positioning device comprises an x,y translation stage. Preferably, the third positioning device comprises an x,y,z translation stage.

Preferably, the mechanical interface comprises three or more interface elements, for mechanically abutting, in use, an optical bench or other optical equipment. Preferably, the interface elements comprise v-grooves or balls having integral projections.

Preferably, the spacing of the pinhole member to the mechanical interface is about 200 mm to about 700 mm, and is more preferably about 500 mm. Preferably, the spacing of the lower reference ring to the mechanical interface is about 50 mm to about 200 mm, and is more preferably about 100 mm. Preferably, the spacing between the two reference rings is about 100 mm to about 300 mm, and is more preferably about 200 mm. Preferably, the pinhole member includes a pinhole of about 5 um to about 100 um diameter, more preferably about 20 um diameter. Preferably, the two reference rings have a diameter of about 100 mm to about 800 mm diameter, more preferably about 500 mm (lower reference ring) and 400 mm diameter (upper reference ring).

According to another aspect of the invention there is provided an alignment tool for calibrating an optical bench and/ or use in alignment of an optical system, the optical system including multiple nested mirrors attached to a mechanical support, the tool comprising: a first plate, an intermediate ring and a second plate, the first plate, intermediate ring and second plate being disposed spaced apart axially in sequence; a first positioning device, attached to the first plate and to a first pinhole member; the first positioning device being adapted for precisely adjusting the position of the first pinhole member in three dimensions; a second positioning device, attached to the second plate and to a second pinhole member; the second positioning device being adapted for precisely adjusting the position of the second pinhole member in two dimensions; a mechanical interface, the mechanical interface being mounted on or integral with the intermediate ring and being substantially identical in form to that of the mechanical support of the optical system.

Preferably, in use, the axis of the tool is vertical, and the first plate is disposed uppermost and the second plate is disposed lowermost. Preferably, the first positioning device comprises an x,y,z translation stage. Preferably, the second positioning device comprises an x,y translation stage.

Preferably, the mechanical interface comprises three or more interface elements, for mechanically abutting, in use, an optical bench or other optical equipment. Preferably, the interface elements comprise balls having integral projections.

Preferably, the spacing of the first pinhole member to the mechanical interface is about 100 mm to about 500 mm, and is more preferably about 300 mm. Preferably, the spacing of the first pinhole member to the second pinhole member is about 300 mm to about 1000 mm, and is more preferably about 500 mm. Preferably, the first pinhole member includes a pinhole of about 5 um to about 100 um diameter, more preferably about 20 um diameter. Preferably, the second pinhole member includes a pinhole of about 0.3 mm to about 2 mm diameter, more preferably about 1 mm diameter. Preferably, the intermediate ring has a central aperture of about 50 mm to about 300 mm diameter, more preferably about 100 mm diameter.

An advantage of the invention is that it assures plug-in mounting of the optical system on the lithography facility, avoiding additional adjustments.

A further advantage of the invention is that the optical system (that comprises many mirrors fixed to the mechanical interface) can be dismounted from the optical bench and plugged straight into the lithographic tool. It is automatically aligned within the required tolerances.

A further advantage of the invention is that the alignment tool affords essentially guaranteed alignment between the optical axes of each mirror (shell) and the interface of the mechanical support, within small tolerances.

Embodiments of the invention will now be described in detail, by way of example, with reference to the accompanying drawings, in which:

BRIEF DESCRIPTION OF THE DRAWINGS

In the description and drawings, like numerals are used to designate like elements. Unless indicated otherwise, any individual design features and components may be used in combination with any other design features and components disclosed herein.

DETAILED DESCRIPTION OF THE INVENTION

In the illustrations of optical elements or systems herein, unless indicated otherwise, cylindrical symmetry around the optical axis is assumed; and references to an "image focus" are references to an image focus or to an intermediate focus.

In one aspect, the invention consists in the alignment tool that is used during the process of assembling the mirrors of an optical system (optical co-alignment and fixation to the mechanical support), performed on a dedicated optical bench.

Figure 3:
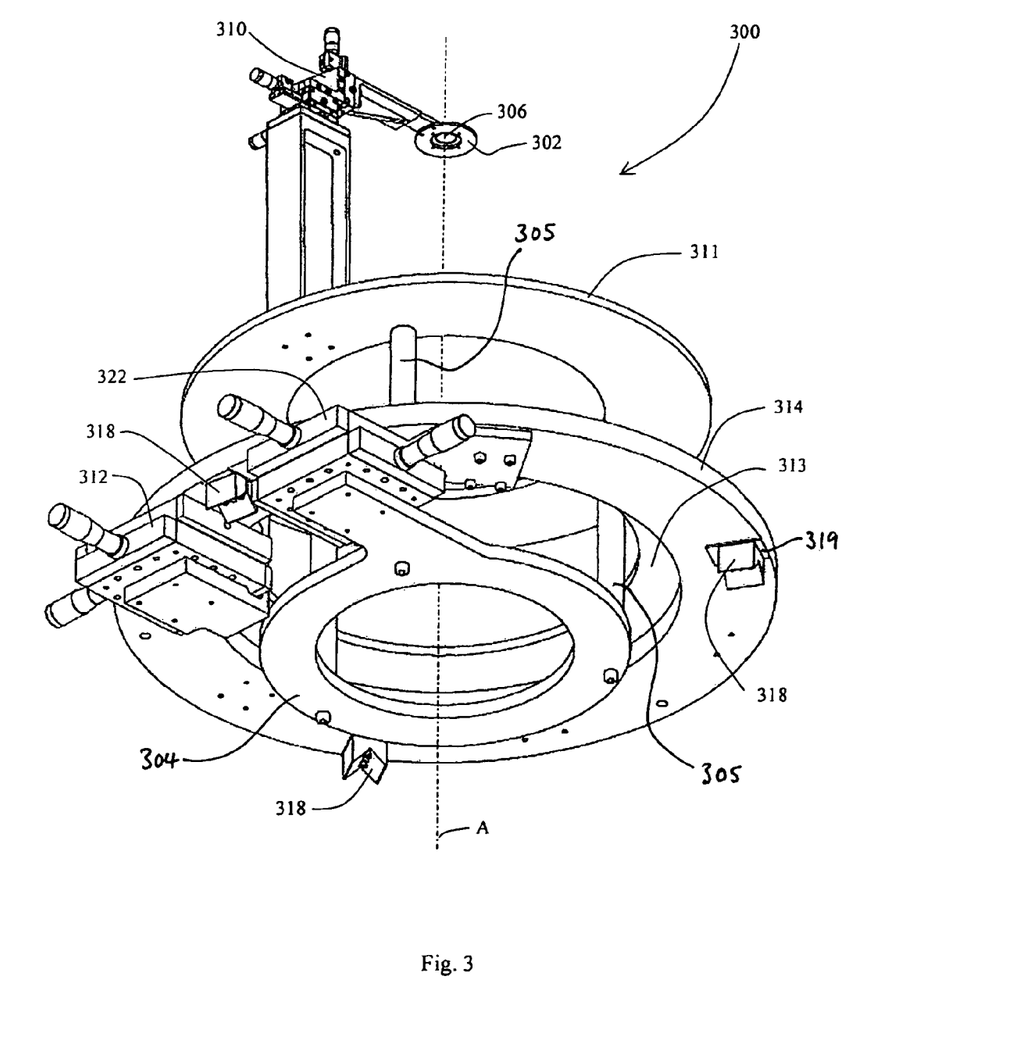
FIG. 3 is a perspective side view of the alignment tool according to a first embodiment of the invention.
Figure 4:
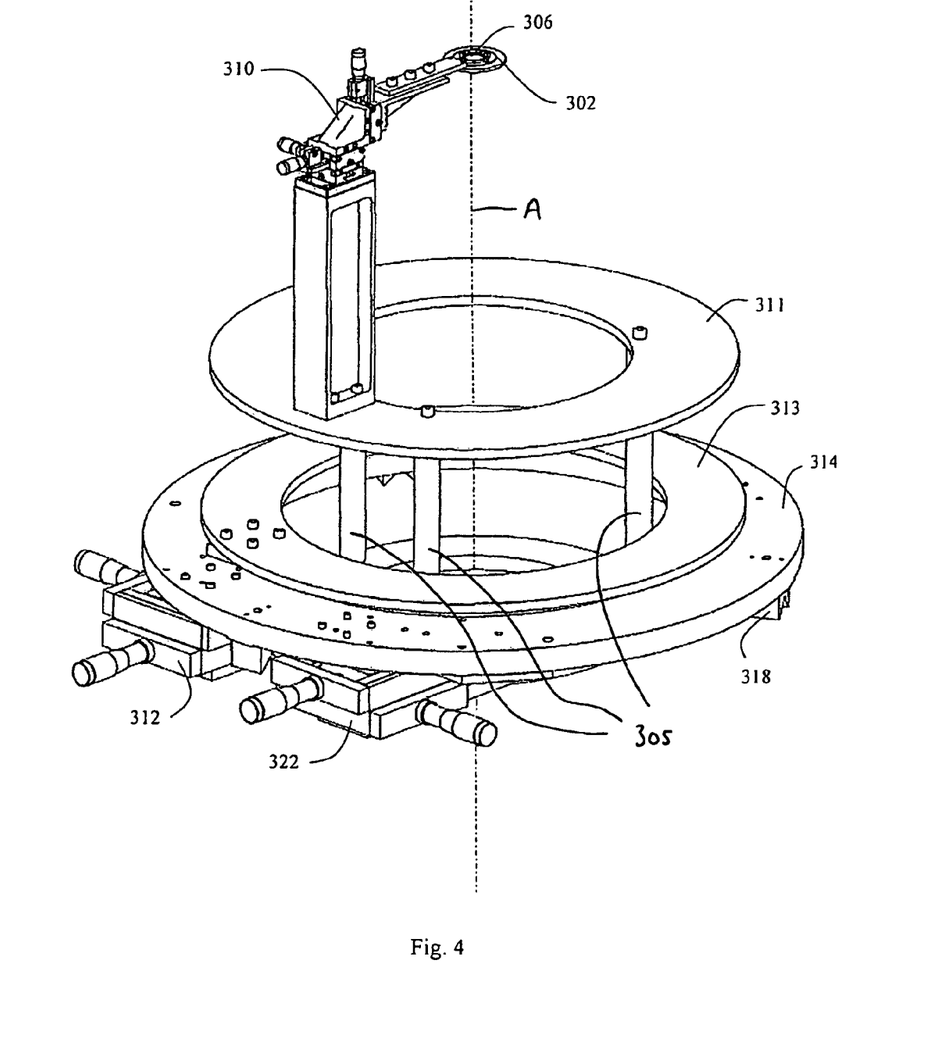
FIG. 4 is a perspective plan view of the alignment tool of FIG. 3.

FIG. 3 is a perspective side view of the alignment tool 300 according to a first, preferred embodiment of the invention; and FIG. 4 is a perspective plan view of the alignment tool 300 of FIG. 3.

Referring to FIGS. 3 and 4, the alignment tool 300 consists of a mechanical structure that supports the pinhole member 302 (pinhole member 302 with a upper pinhole 306 of diameter, e.g., 20 um). The pinhole member 302 is made of any metal (e.g. stainless steel or aluminum) suited to optical applications. The same applies for all other components (excluding the optical system, which may be made by electroforming nickel, or the like) discussed hereinafter, unless indicated otherwise.

Upper pinhole member 302 is mounted on a precise x,y,z translation stage 310, which is in turn mounted on an upper reference ring 311 (outer diameter, e.g., 400 mm). In this embodiment, the pinhole member 302 is positioned such that the spacing between the pinhole 306 and the mechanical interface plate 314 is (vertically) 500 mm.

In use, the upper reference ring 311 is also mounted on a precise x,y translation stage 322 via base ring 304 and support rods 305. The alignment tool 300 includes a lower reference ring 313 (outer diameter, e.g., 500 mm). In use, the lower reference ring 313 is also mounted on a precise x,y translation stage 312.

The alignment tool 300 includes mechanical interface plate 314 (outer diameter, e.g., 600 mm). Provided on the mechanical interface plate 314 is the interface of the alignment tool 300, e.g., comprised collectively of three reference v-grooves members 318. The latter are formed such that the interface of the alignment tool 300 is identical to the interface (not shown) of the mechanical support of the mirrors (collector optical system). Typically, the v-grooves members 318 are mounted on blocks 319 on the mechanical interface plate 314. A indicates the optical axis. It will be appreciated that, for example, reference balls, with or without projections, may be used in place of v-groove members.

Figure 5:
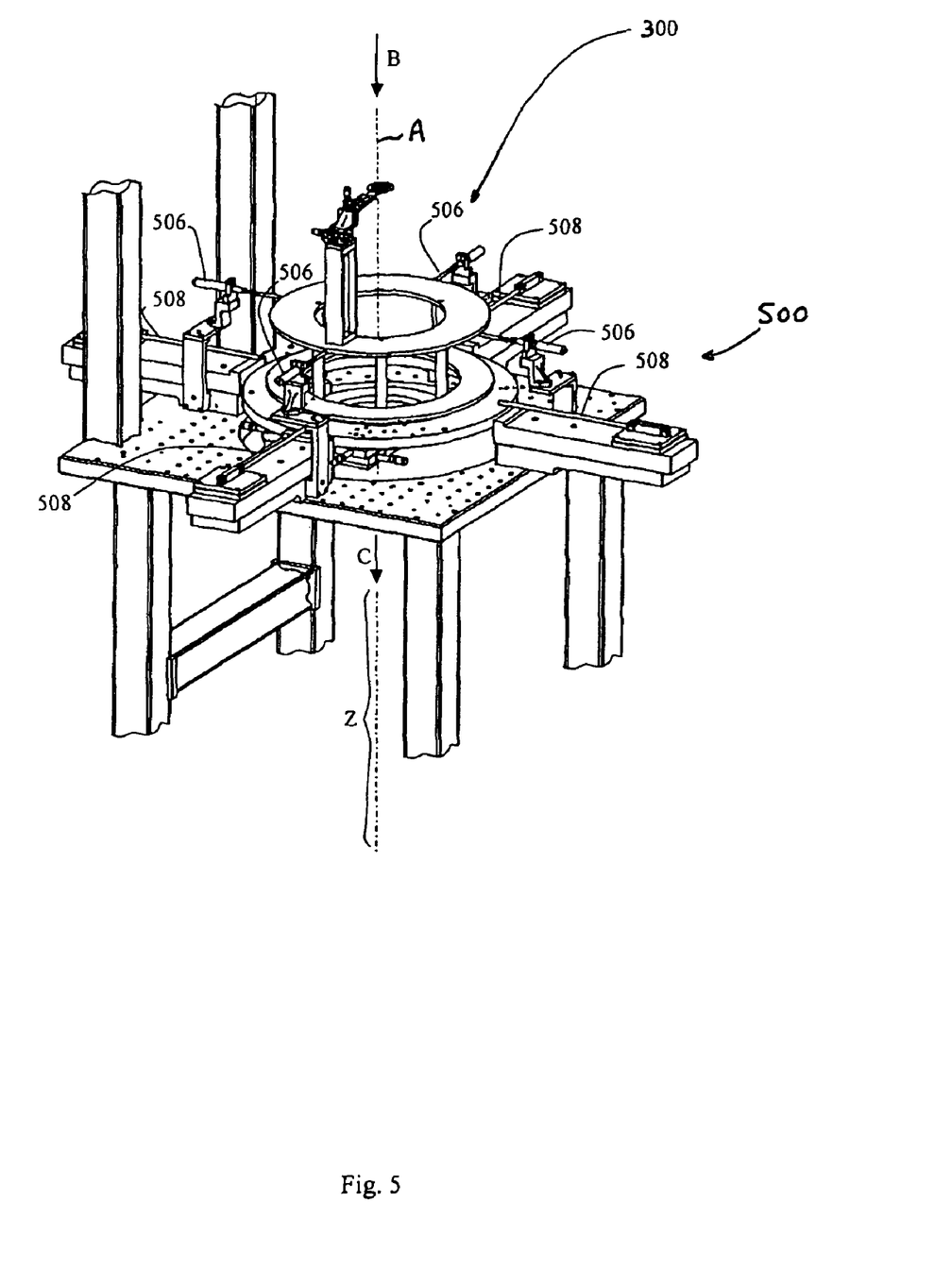
FIG. 5 shows the alignment tool of FIG. 3, when mounted on an optical bench during the optical alignment method according to the invention.
Figure 6A:
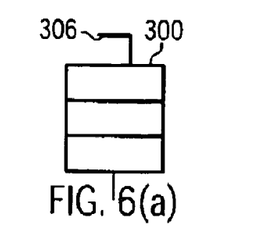
FIG. 6 shows highly schematically in successive steps the method of alignment according to one embodiment of the invention.
Figure 6B:
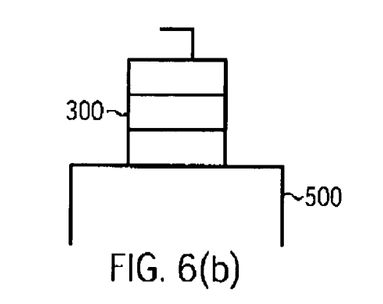
Figure 6C:
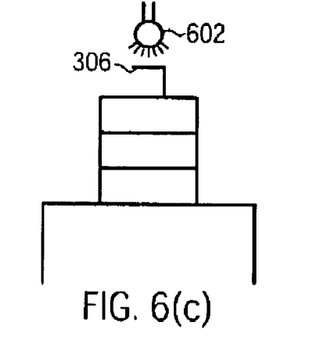
Figure 6D:
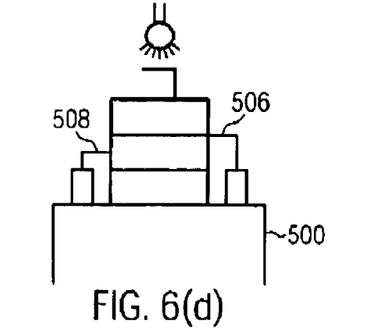
Figure 6E:
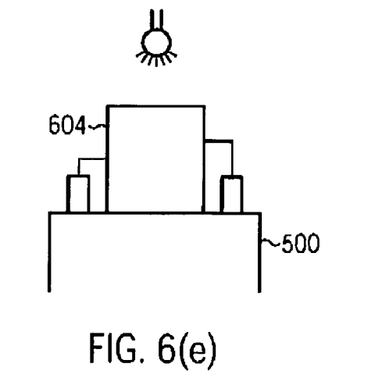
Figure 6F:
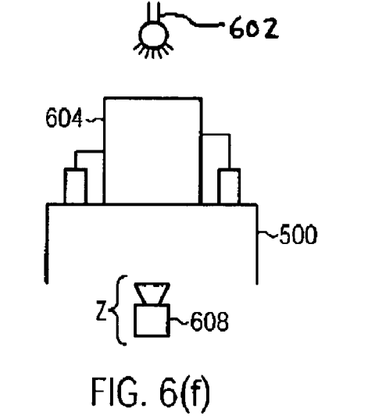
Figure 6G:
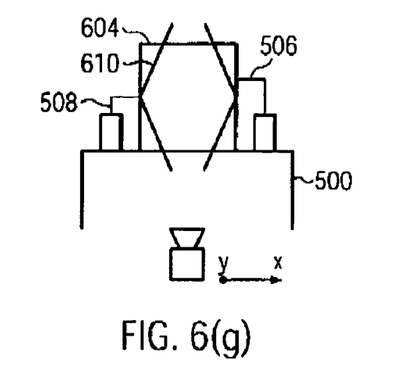
Figure 6H:
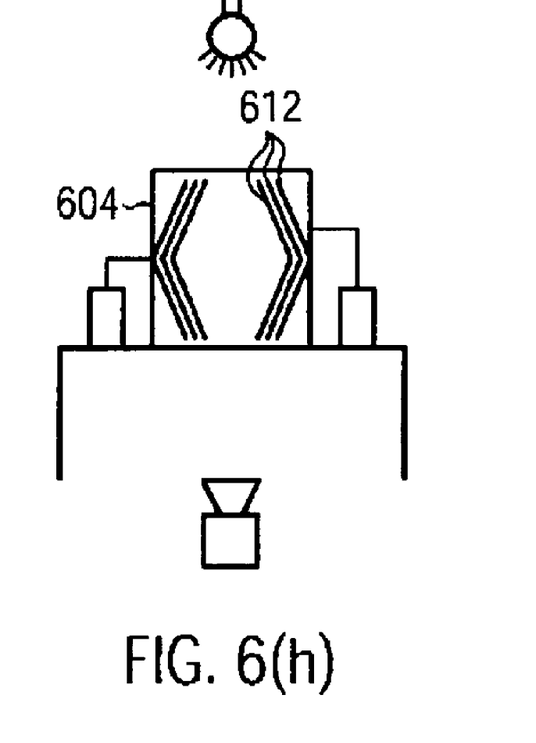
Figure 6I:
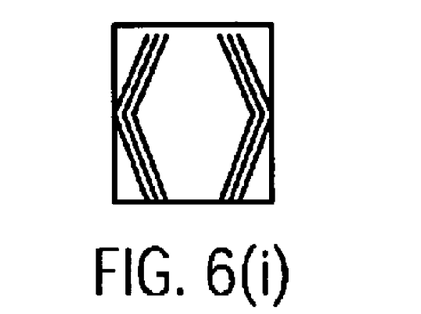

FIG. 5 shows the alignment tool of FIG. 3, when mounted on an optical bench 500 during the optical alignment method according to the invention. The optical alignment method that involves the use of the alignment tool 300 will now be described, with reference to FIGS. 5 and 6 (the latter being an extremely schematic illustration, for the purpose of explanation).

1. As an initial step (FIG. 6(a)), the pinhole 306, the lower reference ring 313 and the upper reference ring 311 are aligned to the three v-groove members 318 by means of their translation stages 310, 312 and 322, respectively, and by the use, for example, of a 3D coordinate machine (the pinhole 306 is aligned in x,y,z; the lower reference ring 313 and the upper reference ring 311 in x,y).
2. Next (FIG. 6(b)), the alignment tool 300 is positioned on the optical bench 500 (i.e., the one that will be used later to co-align the mirrors of the collector optical system (not shown)).
3. Then, a laser source 602 (FIG. 6(c)) disposed above the optical bench 500, and directing radiation substantially in the direction of arrow B, is aligned in x, y, z by maximizing the amount of light passing through the pinhole 306.
4. Next (FIG. 6(d)), micrometers 506 and 508 (that will be used to measure and control the transverse alignment of the mirrors) are positioned on the optical bench 500 and are then aligned with respect to the reference rings 311 and 313 of the alignment tool 300. The upper reference ring 311 and lower reference ring 313 are co-aligned to the v-grooves 318. These rings 311, 313 are the reference used to calibrate the zero of the micrometers 506 and 508: the micrometers 506 ensure the radial position of the upper reference ring 311 and micrometers 508 ensure the radial position of the lower reference ring 313.
5. The alignment tool 300 is then removed from the optical bench 500.
6. As a next step (FIG. 6(e)), the mechanical support 604 of the mirrors is placed on the optical bench 500.
7. A CCD camera 608 is then placed in the area Z (below the optical bench 500) where the focus of the mirrors (not shown) will arrive (see FIG. 6(f)). It is aligned along the optical axis A by placing it at the nominal distance (e.g., 2 m) from the laser source 602.
8. Then (FIG. 6(g)), a reference mirror 610 is placed on the optical bench 500, aligned relatively to the micrometers 506 and 508 and relative to the laser source 602.
9. The CCD camera 608 is then aligned in x, y directions by centering the focus of the reference mirror 610 in the center of the CCD sensor.
10. Next, the reference mirror 610 is removed from the optical bench 500.
11. Then, the mirrors 612 that will form the collector optical system 614 are placed on the optical bench 500, aligned to the mechanical interface (not shown) of the mechanical support 604, and fixed to the mechanical support 604; see FIG. 6(h).

Figure 10:
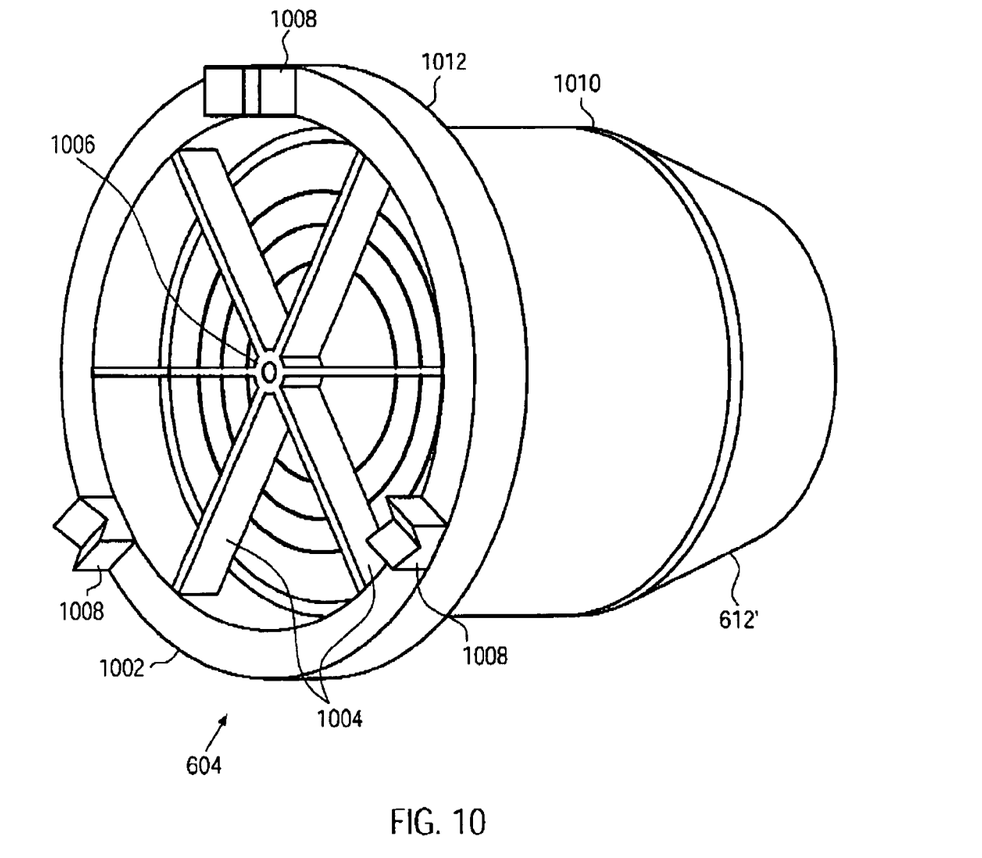
FIG. 10 illustrates the actual form of the mechanical support in accordance with one embodiment of the invention, and having Wolter I mirrors attached thereto.

The mirrors 612 are attached in sequence, by any suitable means, to the mechanical support, starting with the smallest (innermost) mirror. FIG. 10 illustrates the actual form of the mechanical support 604 in accordance with one embodiment of the invention, and having Wolter I mirrors attached thereto. The mechanical support 604, usually called a "spider", resembles a bicycle wheel. The mechanical support 604 is composed of a cylindrical external ring 1002 having arms 1004 connected to a smaller central ring 1006. A set of v-grooves 1008 (here: three) is attached to the external ring 1002. The outer diameter of the upper reference ring 311 (see FIGS. 3-5) is equal to the diameter of the intermediate section 1010 of the largest (outer) mirror 612' to be aligned, while the outer diameter of the lower reference ring 313 is equal to the diameter of the lower section 1012 of the largest (outer) mirror 612' to be aligned. For the attachment of each mirror 612, the mirror is supported from the bottom at three points; it is moved (e.g. millimetre distances or less) in x,y,z (3 translations) and theta, phi (2 rotations) by means of precise translation stages and micrometers attached directly to the optical bench 500. The position of the mirror is controlled by the readings of the 4 micrometers 508 for the x,y values and by the readings of the focus image recorded by a ccd camera 608 for the z, theta, phi values.

12. Finally (returning to FIG. 6(i)), the collector optical system 614, that now comprises many mirrors fixed to the mechanical support 604, is dismounted from the optical bench 500 and may be plugged into the lithographic tool (not shown). The optical system 614 is automatically aligned within the required tolerances.

The tolerances are, for example:
longitudinal position of source<20 um;
transverse position of source<20 um;
longitudinal position of mirror<50 um;
transverse position of mirrors<50 um;
tilt of mirror<0.5 mrad;
longitudinal position of second focus of mirrors<2.5 mm; and
transverse position of focus of mirrors<0.5 mm.

Figure 7:
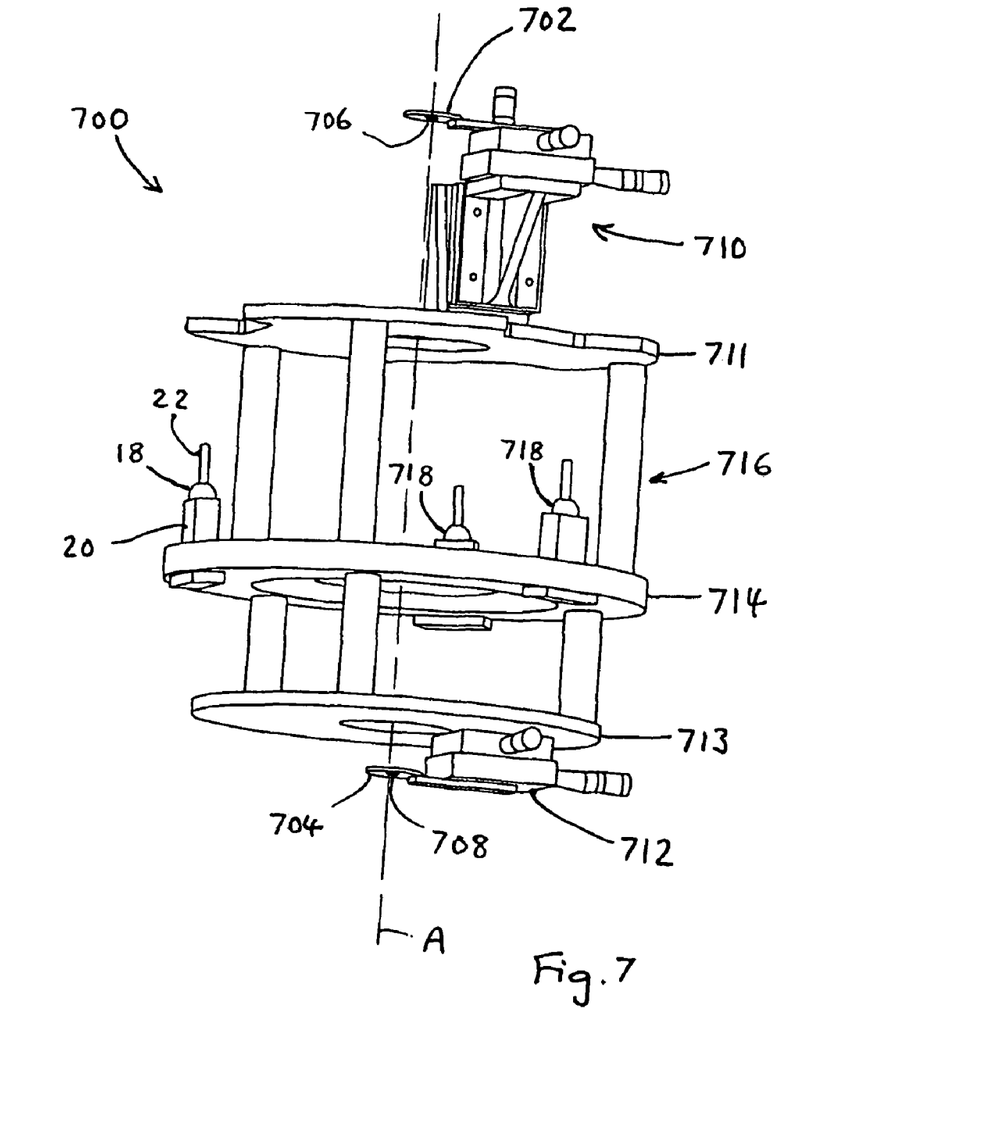
FIG. 7 is a perspective side view of the alignment tool according to a second embodiment of the invention.
Figure 8:
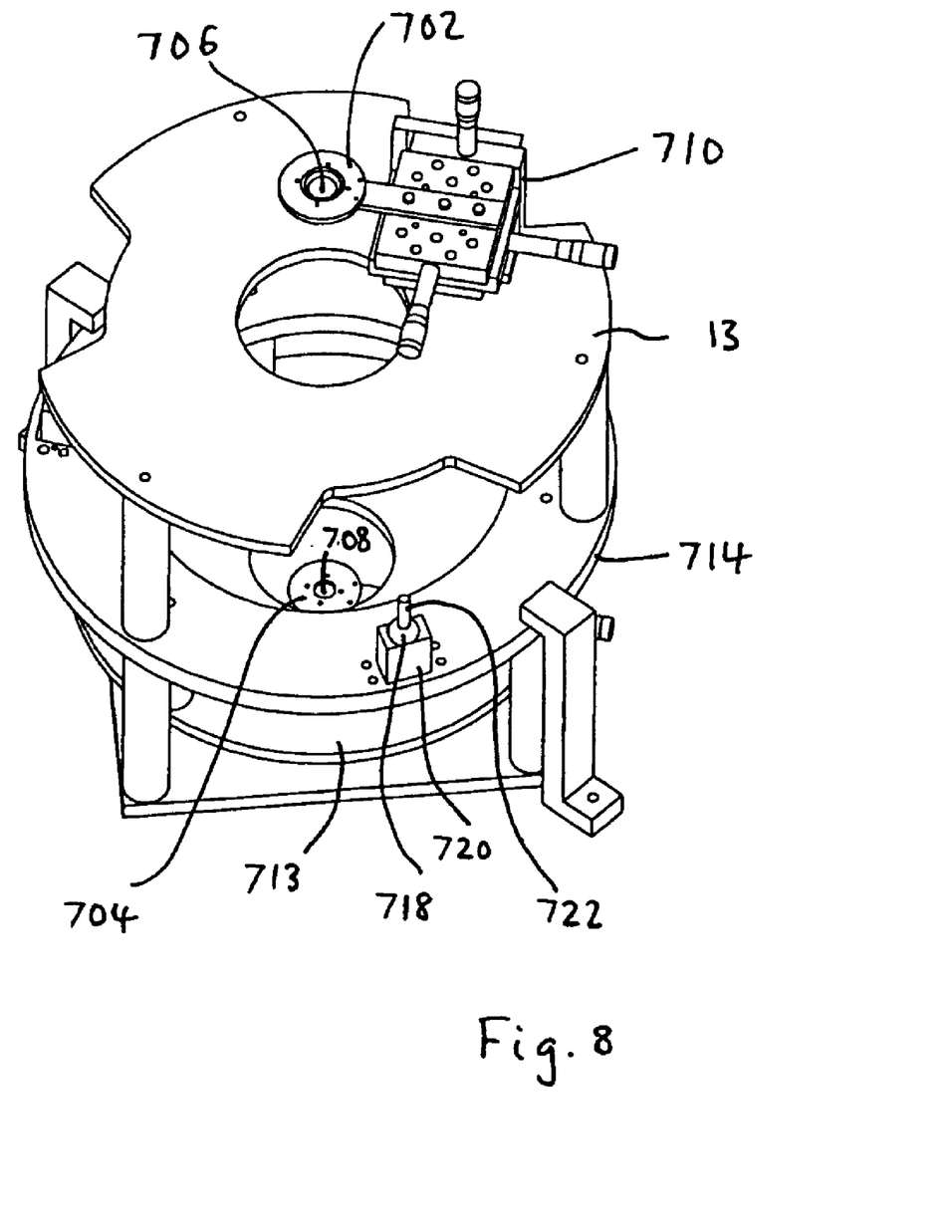
FIG. 8 is a perspective plan view of the alignment tool of FIG. 7.

FIG. 7 is a perspective side view of the alignment tool 700 according to a second embodiment of the invention; and FIG. 8 is a perspective plan view of the alignment tool 700 of FIG. 3.

Referring to FIGS. 7 and 8, the alignment tool 700 consists of a mechanical structure that supports two pinholes members 702, 704 (upper pinhole member 702 with a upper pinhole 706 of diameter, e.g., 20 um; lower pinhole member 704 with a lower pinhole 308 of diameter, e.g., 1 mm).

Upper pinhole member 702 is mounted on a precise x,y,z translation stage 710, which is in turn mounted on an upper plate 711; and lower pinhole member 704 is mounted on a precise x,y translation stage 712, which is in turn mounted on a lower plate 713. In this embodiment, the pinholes members 702, 704 are positioned such that the pinholes are (vertically) 500 mm apart.

The alignment tool 700 also includes a reference ring 714 (inner diameter, e.g., 100 mm). In use, the reference ring 714 is also mounted on a precise x,y translation stage (not shown). Provided on the reference ring 714 is the interface 716 of the alignment tool 700, e.g., comprised collectively of three reference balls 718. The latter are formed such that the interface 716 of the alignment tool 700 is identical to the interface (not shown) of the mechanical support of the mirrors (collector optical system). Typically, the reference balls 718 are mounted on blocks 720 attached (e.g. by bolting) to the reference ring 714, and include rods 722 projecting (parallel to the optical axis A) therefrom. It will be appreciated that, for example, v-groove members, with or without projections, may be used in place of reference balls.

Figure 9:
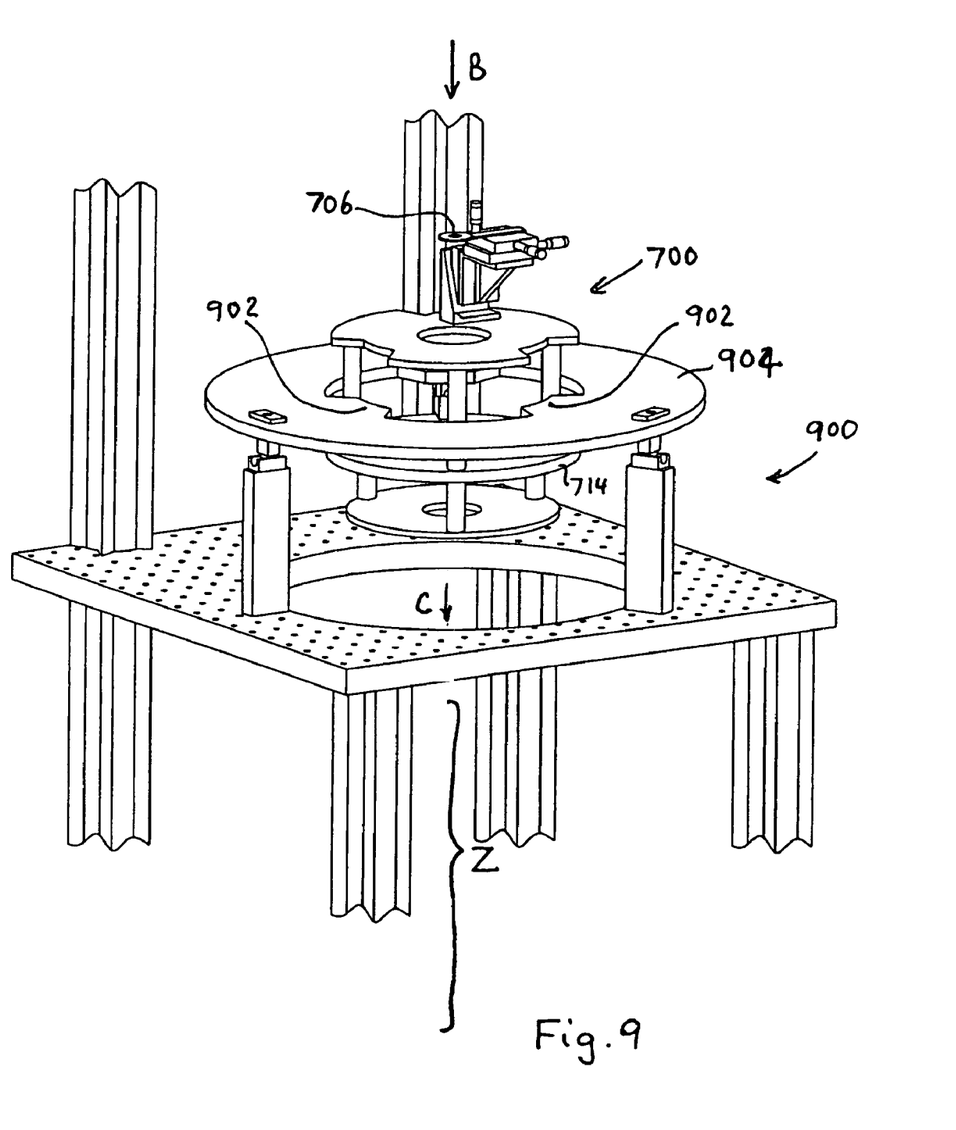
FIG. 9 shows the alignment tool of FIG. 7, when mounted on an optical bench during the optical alignment method according to the invention.

FIG. 9 shows the alignment tool of FIG. 7, when mounted on an optical bench 900 during the optical alignment method according to a second embodiment of the invention. The optical alignment method that involves the use of the alignment tool 700 will now be described. This is the same as the method described with reference to FIGS. 5 and 6, except as described below.

1. As an initial step, the upper pinhole 706, lower pinhole 708 and the reference ring 714 are aligned to the three reference balls 716 by means of their translation stages 710, 712 and by the use, for example, of a 3D coordinate machine (upper pinhole 706 is aligned in x,y,z; lower pinhole 708 and reference ring 714 in x,y).
2. Next, the alignment tool 700 is positioned on the optical bench 900 (i.e., the one that will be used later to co-align the mirrors of the collector optical system (not shown)).
3. Then, a laser source (not shown) disposed above the optical bench 900, and directing radiation substantially in the direction of arrow B, is aligned respect to the upper pinhole 706 by maximizing the amount of light passing through the upper pinhole 706.
4. A CCD camera (not shown) is then placed in the area Z (below the optical bench 900) where the focus of the mirrors (not shown) will arrive. It is aligned by centering the light beam transmitted (substantially in the direction of arrow C) through the lower pinhole (not shown).
5. Micrometers (that will be used to measure and control the transverse alignment of the mirrors) positioned on the optical bench 900 are then aligned respect to the reference ring 714 of the alignment tool 700.
6. Next, the alignment tool 700 is removed from the optical bench 900;
7. As a next step, the mechanical support (not shown) of the mirrors is placed on the optical bench 900, the mechanical interface (not shown) of the mechanical support (not shown), engaging tags 902 formed integrally with support plate 904 of the optical bench 900.
8. Then, the mirrors (not shown) are placed on the optical bench 900, aligned to the mechanical interface (not shown) of the mechanical support (not shown), and fixed to the mechanical support (not shown).
9. Finally, the optical system (not shown), that now comprises many mirrors fixed to the mechanical support (not shown), can be dismounted from the optical bench 900 and may be plugged into the lithographic tool (not shown). The optical system is automatically aligned within the required tolerances.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

The invention claimed is:

1. A method of calibrating an optical bench for an optical system that includes multiple nested mirrors attached to a mechanical support, the method comprising:
(a) providing an alignment tool relative to the optical bench, the alignment tool comprising a mechanical interface plate, a lower reference ring, an upper reference ring and a pinhole member, all being disposed axially spaced apart in sequence; a first positioning device attached to the mechanical interface plate and to the lower reference ring, and adapted to adjust the position of the lower reference ring in two dimensions; a second positioning device attached to the mechanical interface plate and to the upper reference ring and adapted to adjust a position of the upper reference ring in two dimensions; a third positioning device attached to the upper reference ring and to the pinhole member, and adapted to adjust a position of the pinhole member in three dimensions; and a mechanical interface mounted on or integral with the mechanical interface plate and corresponding in form to the mechanical support of the optical system;
(b) aligning the pinhole member to an axis defined by the mechanical interface;
(c) mounting the tool on the optical bench used to co-align the optical system mirrors;
(d) positioning a light source-axially and adjacent the pinhole member;
(e) aligning the light source relative to the pinhole;
(f) positioning a light sensor axially and adjacent the mechanical interface plate at where a focus of the mirrors would be;
(g) aligning the light sensor along the optical axis relative to the light source;
(h) aligning measurement devices of the optical bench with respect to the two reference rings; and
(i) removing the alignment tool from the optical bench.

2. The method of claim 1, wherein (b) comprises using the first, second and third positioning devices, respectively, and a three-dimensional coordinate machine.

3. The method of claim 1, wherein (d) includes maximizing the amount of light passing through the pinhole member.

4. The method of claim 1, wherein (e) comprises centering the light focused by a reference mirror onto the light sensor.

5. The method of claim 1, further comprising:
(l) mounting the mechanical support on the optical bench;
(m) positioning a reference mirror on the optical bench;
(n) aligning the reference mirror relatively to the light source and to the reference rings;
(o) removing the reference mirror from the optical bench;
(p) attaching the mirrors to the mechanical support, thereby forming the optical system; and
(q) removing the optical system from the optical bench.

6. The method of claim 1, further comprising:
disposing the multiple nested mirrors onto the optical bench and aligning the mirrors with each other and with respect to the mechanical support.

* * * * *